US008618966B2

(12) United States Patent
Kanter et al.

(10) Patent No.: US 8,618,966 B2
(45) Date of Patent: Dec. 31, 2013

(54) PHOTONIC ASSISTED ANALOG-TO-DIGITAL CONVERSION USING PHASE DETECTION

(75) Inventors: Gregory S. Kanter, Chicago, IL (US); Daniel Reilly, Chicago, IL (US)

(73) Assignee: Nucript LLC, Evanston, IL (US)

( * ) Notice: Subject to any disclaimer, the term of this patent is extended or adjusted under 35 U.S.C. 154(b) by 93 days.

(21) Appl. No.: 13/400,324

(22) Filed: Feb. 20, 2012

(65) Prior Publication Data

US 2012/0212360 A1    Aug. 23, 2012

Related U.S. Application Data

(60) Provisional application No. 61/445,124, filed on Feb. 22, 2011, provisional application No. 61/533,577, filed on Sep. 12, 2011.

(51) Int. Cl.
*H03M 1/00* (2006.01)

(52) U.S. Cl.
USPC .......................................... 341/137; 341/155

(58) Field of Classification Search
USPC .................... 341/137, 155, 120, 159
See application file for complete search history.

(56) References Cited

U.S. PATENT DOCUMENTS

| 4,928,007 | A | * | 5/1990 | Furstenau et al. | 341/137 |
| 5,253,309 | A | * | 10/1993 | Nazarathy et al. | 385/4 |
| 6,611,339 | B1 | * | 8/2003 | Yang et al. | 356/485 |
| 7,990,299 | B2 | * | 8/2011 | Bell | 341/137 |

* cited by examiner

*Primary Examiner* — Brian Young
(74) *Attorney, Agent, or Firm* — Nadya Reingand

(57) ABSTRACT

A method of digitizing an analog electrical signal combines optical and electronic techniques in order to improve the resolution, sampling rate, input frequency range, or flexibility. It implements an optical interferometric modulator, which modulates an input optical signal by the input electrical signal combined with a calibration signal. A set of two or more photoreceivers receiving the output optical signals from the optical modulator produce output electrical signals, which are digitized and processed in a DSP to produce a digitized version of the electrical input signal, and a digitized calibration signal value is used to optimize the input electrical signal digitization. The method and the device can be used in many fields including instrumentation, communications, and imaging.

30 Claims, 7 Drawing Sheets

PHOTONIC ASSISTED ANALOG-TO-DIGITAL CONVERSION USING PHASE DETECTION

CROSS-REFERENCE TO RELATED APPLICATIONS

This patent application claims priority to U.S Provisional application No. 61/445,124 filed on Feb. 22, 2011 and No. 61/533,577 filed on Sep. 12, 2011.

RIGHTS HELD BY GOVERNMENT ORGANIZATIONS

The United States Government has certain rights to this invention pursuant to contract No. FA9550-09-C-0153.

FIELD OF THE INVENTION

The present invention relates to a method of digitizing an analog signal. Such a function is commonly used in many fields including measurement/instrumentation, communications, and imaging. The invention combines optical and electronic techniques in order to improve the resolution, sampling rate, input frequency range, or flexibility typically achievable.

BACKGROUND

Analog-to-digital converters (ADCs) allow for an analog input signal to be sampled into the digital domain. ADCs have found wide-spread use in communications, as it allows the digitized signals to be processed with powerful digital signal processing (DSP) techniques. As electronic ADCs have developed, uses in RF-wireless communications such as cellular telephony and software defined radio have been made possible. ADCs in RF-wireless applications typically have high resolutions because bandwidth restrictions require the use of dense signal constellations. Other common uses for ADCs include instrumentation, such as high-speed real-time oscilloscopes, medical imaging, and radar.

Electronic ADC's have made steady technological progress, but issues such as clock-jitter and internal parameter mismatches make it difficult for ADCs to maintain high resolution, typically measured in effective number of bits (ENOB), as the sampling rate increases. It is common for ENOB to fall 1 bit for every factor of 2 rate increase, for example, see U.S. Pat. No. 5,010,346 by Hamilton et al.

Photonic technology can be used to aid in creating faster ADCs. The performance improvement is due to various factors depending on the specific design, but may stem, for instance, from the ability to generate ultra-short pulses with ultra-low timing jitter in the optical domain. Although progress has been made in optical ADC technology, there are few experimentally verified cases where optical ADCs reach their expected potential. For instance, as it is shown in U.S. Pat. No. 5,010,346 by Hamilton et al., when multiplexing is used to reach high sample rates differences in the parameters of the optical-to-electrical (O/E) detectors and the subsequent electrical ADCs used to sub-sample the signal make the process of recombining the various ADC outputs into a single higher-rate output imperfect and can cause performance degradation. Also, there is a nonlinearity problem in many modulators used to transfer the RF signal into the optical domain. This nonlinearity problem can cause unwanted distortions in the signal. It can be managed by reducing the size of the modulation on the optical signal to much less than $\pi$ radians, however this technique also reduces the inherent signal-to-noise ratio of the measured signal. Some of the aforementioned problems can be alleviated by using phase modulation, which is naturally linear, as opposed to amplitude modulation which is typically nonlinear, such as the sinusoidal response from a Mach-Zehnder modulator. Using phase modulation requires a phase-detector which can be implemented in several ways. For instance, Twichell et al. in U.S. Pat. No. 5,955,875 used a modulator with two optical outputs, digitized the two outputs, then applied an inverse transformation via a digital signal processor to re-construct the voltage applied to the modulator. The most common modulator to use is a dual-output Mach-Zehnder modulator, but that restricts the applied voltage to somewhat less than $\pi$ radians (assuming NyQuist sampling). Such a dual-detection method is inherently less sensitive to optical power fluctuations than a single-detector design.

A full $2\pi$ modulation could be measured using coherent detection, but this tends to be more complex and expensive than other detection methods. A full modulation can also be measured using an optical hybrid that allows the measurement of both the in-phase and quadrature phase (I and Q) portions of the signal such as shown in U.S. Pat. No. 4,732,447 by Stephen Wright et al. Such a method was used for RF photonic links in "Coherent optical phase-modulation link," IEEE Photonics Technology Letters, v. 19, no 16, pp 1206-1208, Aug. 15, 2007 by T. R. Clark and M. L. Dennis and for digitizing differential M-ary modulated optical signals in U.S. Provisional patent application Ser. No. 12/482,267 "System and method for data transmission over arbitrary medium using physical encryption," filed Jun. 10, 2009.

Photonic ADCs often make use of low jitter optical and/or electrical signals, since low jitter results in higher ENOB performance especially when digitizing high frequency signals. One promising method of generating both low jitter optical and electrical signals is to use an opto-electronic oscillator (OEO) U.S. Pat. No. 6,567,436 by Yao et al. Other methods include mode-locked lasers.

Jitter in the sampling pulse train can be measured by integrating the phase-noise spectrum of the sampling pulse train around the repetition frequency, where typically the integration is performed over a spectrum of ½ the sample rate. In a NyQuist sampling system the sample rate is twice the highest frequency component of the signal to be digitized. Thus a 10 Giga-sample-per-second (10 Gsps) sampling train can digitize signals from 0-5 GHz and the relevant jitter bandwidth is integrated to 5 GHz.

In addition to the standard NyQuist sampling ADC there are times when under-sampling at lower frequencies can be useful. Under-sampling allows a high carrier frequency to be digitized with a sample rate much less than twice the carrier frequency, but the sample rate must still be at least twice the total bandwidth of the signal. The low jitter and small aperture time of mode-locked lasers can be helpful in these applications. If for instance a 5 GHz center frequency signal can be sampled with a 200 MHz sample rate, in which case the instantaneous measurement bandwidth is 100 MHz and the relevant jitter bandwidth should be integrated to 100 MHz.

What is needed is an optical ADC with high resolution. It should be insensitive to power fluctuations in the optical source, have a high linearity ideally even when being strongly modulated by more than $\pi$ radians, and be capable of providing ENOBs even greater than the ENOB of the electrical ADCs employed in the system. Ideally the system should be compatible with the use of integrated optics. The system should have a self-calibration and self-monitoring function to optimize and monitor the system performance. The system should be scalable to high sample rates (10's of Gsps or more) and/or it should be able to operate in the under-sampling mode of operation where a high carrier frequency, for instance of several GHz to many 10's of GHz, can be digitized over a relatively small bandwidth using a low sample rate of at least twice the signal bandwidth. It is desirable if the same system can operate in both the NyQuist and under-sampling modes either simultaneously or by user selection, or in a mode where under-sampling is performed at two or more different sampling frequencies. This selection can be useful since a lower rate sampling mode may have higher resolution performance, but only for those class of signals for which it is capable of digitizing. The added functionality of switching between lower and higher rate sampling modes should come with relatively little added cost or complexity. It is also desired that several independent signals can be digitized using a single ADC system. These signals may require different sample rates and have different target ENOBs. It is desired that this added functionality come with only incremental increases in cost, size, and power consumption.

SUMMARY

The invention is a photonic assisted ADC system which is inherently robust and capable of high resolutions at high sample rates or when under-sampling signals with high carrier frequencies. The system makes use of measuring the phase shift induced by the applied signal to be digitized via an optical modulator by splitting an optical signal into a signal arm and a reference arm, modulating the optical signal in the signal arm with the applied signal using a phase modulator, and combining the phase modulated signal with the reference signal using an optical combiner such that the reference and signal are combined in multiple output ports with different relative combining phases. In a typical case where the reference and signal are combined in an optical hybrid with a 90 degree relative phase difference between the signal and reference arm combining phases, the output signals are typically called the in-phase and quadrature-phase (I and Q). The I and Q signals are created by splitting an input optical signal source into two branches, phase modulating one branch with the desired signal to be digitized, then combining the two branches in an I-Q optical hybrid. Thus the system forms a kind of interferometer, where the interference between the signal arm and reference arm is recorded. The I and Q signals can be captured by detecting them with optical-to-electrical detectors and digitizing the detector outputs via standard electronic ADCs. The digitized samples are sent to a processor for digital-signal-processing (DSP). DSP allows the applied modulation signal to the optical modulator to be determined, for instance by using a two-dimensional look-up-table which forms a one-to-one correspondence between the I and Q measurement to the applied modulation signal.

Typically the optical modulator is a phase modulator, and by measuring the phase shift directly a full $2\pi$ modulation (or even more when over-sampling) can be applied to the phase modulator thus increasing the signal-to-noise ratio (SNR) without sacrificing linearity. Additionally, the detection method can have inherently higher resolution than the resolution of the electronic ADCs used to convert the optical signal into an electronic signal. This enhanced resolution stems from the ability of the I-Q based optical ADC to judiciously use both electronic ADC outputs to digitize over a $2\pi$ phase range.

The photonic assisted ADC should account for various non-idealities in the system if it is to maintain high resolution. For instance, in practice the optical hybrid may not have exactly a 90° (½) phase shift between the arms. Such non-idealities can be accounted for in the signal-processing section. As another example, the offset and scale of each digitized output of the optical signal digitization block may differ and change over time depending on the optical power level and component aging. We will describe a method of automated calibration which will allow the necessary parameters to be extracted and, if necessary, periodically re-calculated in order to account for issues such as component aging. This method will apply a calibration signal to the phase modulator, with the calibration signal being time or frequency multiplexed with the signal to be digitized and the multiplexing of the calibration signal being under the control of a control unit, and calculate the required parameters in order to optimize the ENOB or some other performance metric. Several methods could be used to generate the calibration signal, including a relatively inexpensive electronic oscillator of lower frequency than the sample rate. The frequency dependence of the system can be determined if a plurality of calibration frequencies are available. If multiple calibration signal frequencies can be applied simultaneously, then mixing distortions can also be measured. In addition to optimizing the calibration parameters, the system performance can be measured and monitored.

When using a sinusoidal calibration signal it is best when its mean frequency is substantially less than the sample rate, or when the mean frequency is unrelated to the sampling frequency, or when the mean frequency is otherwise related in such a way that the samples well cover the possible amplitude levels of the signal, as for instance would occur if the sinusoid is sampled in at least eight different relative phases. This can be guaranteed in various ways, for instance by choosing a sinusoid frequency of, say $<\frac{1}{10}^{th}$ the sampling rate or by applying two or more different sinusoidal frequencies that differ by a fractional amount. If the calibration signal frequency is well known, it can be used to calibrate the repetition rate of the optical pulse source as well. This is helpful so that the exact sampling rate of the system is known by the processor. The optical pulse repletion rate can alternatively be measured by a frequency measurement device in order to precisely determine the sampling rate. If the input signal to be digitized is a large amplitude and has a constant phase (or otherwise well known phase as a function of time) for a reasonable number of samples, such as for 50 samples, then the signal can be used to self calibrate. This may occur for instance for frequency measurement applications or packetized radio transmissions where prior to modulation a constant sinusoid could be transmitted for a fixed time period.

The size of the input signal to be digitized can be estimated prior to performing the complete signal processing functions and this signal size estimate compared to a threshold value. If the signal size is above the threshold value then additional signal processing is performed while if the signal size is below the threshold some additional signal processing is not performed. In this way the signal processing can be limited to cases when the signal is large enough to be of interest, thereby leading to benefits including reduced power consumption when the signal is likely to be too small to be of interest and reducing the required throughput of the DSP processor.

The optical source in the ADC system could be a short-pulse low jitter source such as a mode-locked laser since the short pulses effectively sample over a short time aperture and can have low timing jitter. The sample rate of the photonic ADC can be increased by using a multi-wavelength pulsed source where the wavelength of the pulses are interleaved in time, thereby allowing for wavelength division multiplexing (WDM) of multiple ADC I and Q measurements.

Instead of increasing the sample rate, WDM can also be used to digitize independent signals. Here multiple phase modulators are located inside the I/Q interferometer, and each phase modulator can modulate an independent signal and is used with a different wavelength. Most of the other system components can be common to all the wavelengths, thereby having size, cost, and power consumption advantages with respect to building multiple systems. The different wavelengths can be of different optical pulse repetition rates thereby having different sample rates. If a single wide-bandwidth pulsed source is used it can feed a number of different phase modulators with pulses of different wavelength after appropriate optical filtering. If desired, the repetition rate of the source can be modified before each respective phase-modulator so that one optical source can be used to sample multiple signals at multiple sample rates. Especially for sub-sampling applications, resonant phase modulators can be used to reduce the power consumption of digitizing a signal of a known frequency band.

If an optical source of pulse repetition frequency f is divided by an integer n into frequency $f_{eff}=f/n$, then the spectral range over which phase noise spectral density should be integrated to obtain the effective jitter is reduced by n. This in turn reduces the effective jitter on the pulse source. Thus, by optically chopping the pulse train into a lower repetition rate, or alternatively using electrical ADCs with input bandwidths fast enough to discriminate the high rate pulses so that only one out of n are measured, it is possible to reduce jitter for a sub-sampling measurement and therefore improve the ENOB. The invention can thus contain an optical modulator to chop the pulse train into a lower rate or contain electrical samplers with suitably high input bandwidths to select only the desired pulses (one of every n pulses) so as to obtain this performance improvement. Also, a slower maximum sample rate on an electronic ADC tends to allow the selection of an ADC with inherently higher ENOB, thus improving system performance In another embodiment optical or electrical taps can be used to tap off a portion of the signals before electrical analog-to-digital conversion so that two different types of optical-to-electrical detectors and/or ADCs can be used, one type optimized for high sample rate signals and the other type optimized for lower sample rate (sub-sampling) applications. The lower sample rate ADC may still have a wide input bandwidth to allow it to discriminate between pulses but also a smaller maximum sampling rate than the high rate ADC. The low rate electronic ADC will typically have higher ENOBs than the high rate ADC, aiding in enhanced performance in the sub-sampling regime. Alternatively, if the optical pulse train is chopped before sub-sampling then a low-rate and low bandwidth ADC can be used as the low-rate ADC, thereby allowing for it to have a very high intrinsic ENOB. By using different ADC types and/or different optical-to-electrical (O/E) converters for the different rates the performance in each regime can be optimized differently. In the case of a fixed frequency optical pulse train with a high repetition frequency, simultaneous NyQuist sampling and sub-sampling can be performed. This might be desirable for a signal with a limited bandwidth over a short time interval, but a larger bandwidth over a longer time interval.

Opto-electronic oscillators (OEO) are useful for generating both the electrical clock that clocks the electronic ADCs and a plurality of optical clocks of controllable wavelength. The low jitter inherent in OEOs, the ease of adding more optical wavelengths of any specified wavelength, and the simultaneous generation of a low-noise electronic clock make the OEO a preferred choice for the optical/electrical signal generation necessary for the proposed optical ADC scheme. Although the OEO uses a wide-optical bandwidth optical modulator such that at the output of the modulator all the optical wavelengths have pulses which overlap in time, the use of a dispersive element in combination with proper tuning of the optical wavelengths can lead to the desired optical pulse train where the high rate optical clock cycles through interleaved pulses of each wavelength.

The proposed method of producing the optical input source is inherently compatible with opto-electronic integration since many of the components are common optical elements. Because of the calibration and control mechanism, the system is robust to parameter mismatches and performance drift that may occur when building a single or small number of optical circuits instead of using many individually optimized components. A design that is compatible with integration is desirable in terms of size, weight, and cost.

DETAILED DESCRIPTION

In the following description, for purposes of explanation, numerous specific details are set forth in order to provide a thorough understanding of the invention. It will be apparent, however, to one skilled in the art that the invention can be practiced without these specific details.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments. In general, features described in one embodiment might be suitable for use in other embodiments as would be apparent to those skilled in the art.

Figure 1:
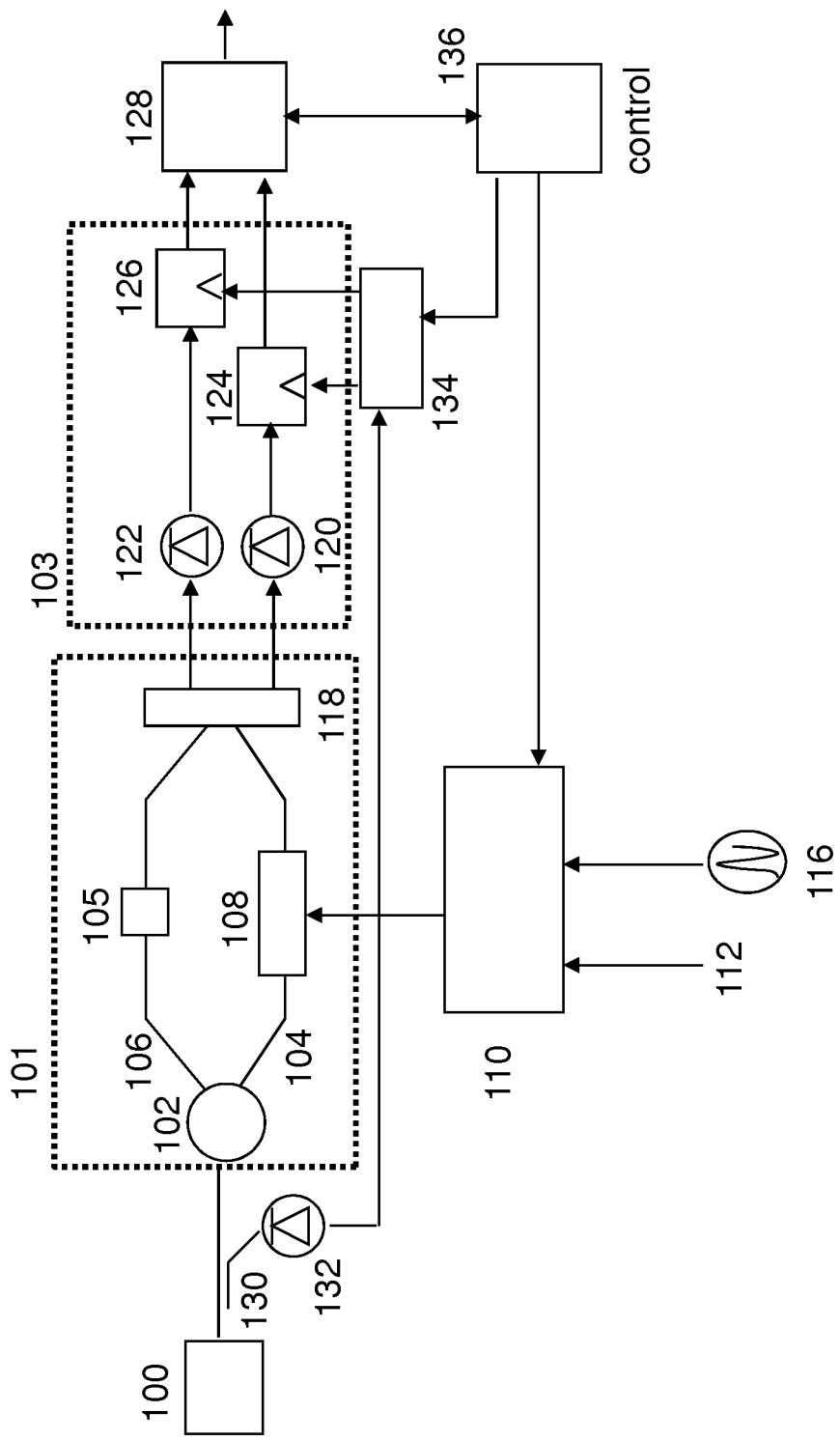
FIG. 1 A single wavelength photonic assisted ADC.

The photonic-assisted ADC architecture of this invention combines an optical source, an optical interferometer containing an optical modulator and having two or more optical output ports, an optical signal digitization block containing multiple optical-to-electrical (O/E) detectors and ADCs, a digital signal processing block, and a controller for system control and calibration. A simple diagram of one embodiment of the invention is shown in FIG. 1. Here an optical signal created by an optical source 100 realized by a mode locked laser producing optical pulses at a repetition frequency f is sent to the optical input port of an optical interferometer 101. The optical input signal is split by an optical power splitter 102 into a signal 104 and reference 106 arm. In many cases it will be desirable that the source and splitter use polarization maintaining (PM) fiber or that the system connections are integrated onto an optical circuit that uses PM waveguides since the polarization of the signal and reference signals should be close to identical when they are later recombined. The signal arm is modulated by a phase modulator 108, where the phase modulator receives an RF input signal from an RF-selector 110. The RF-selector selects one of a plurality of its inputs to send to the phase modulator as the RF modulation voltage. One input to the RF selector is the applied RF signal 112 to be digitized and another is a calibration signal based off an electronic oscillator. Other input signals to the RF-selector could contain oscillators of different frequencies or a ground signal. The controller 136 which can be realized by a microcontroller selects which of the inputs to the RF selector are sent to the phase modulator as the RF modulation voltage, effectively time-multiplexing the calibration signal with the RF input signal. The optical signal after the phase modulator carries a phase modulation that is linearly related to the RF modulation voltage. The reference arm signal propagates through an optical attenuator 105 to make its optical power approximately equal to the signal arm optical power which has been attenuated by propagating through the phase modulator. This power balancing function can also be performed by choosing the splitter 102 to be something other than a 50/50 splitter. The phase-modulated optical signal and the reference arm signal are combined in an optical combiner 118 that combines them into multiple output ports with different relative combining phases. A preferred optical combiner is to use an I-Q optical hybrid where the two outputs contain the two inputs with a relative π/2 phase difference. For simplicity, we will assume an I/Q combiner in all cases, though other couplers such as 3×3 couplers could be used as would be apparent to one skilled in the art. We note that I/Q combiners can be constructed with complementary outputs so that there are four outputs with relative phase differences of {0,π} and {π/2, π/2+π}. The additional complementary outputs can be used to improve the overall signal quality, but for simplicity we will assume just two outputs with 0 and π/2 relative combining phases.

The optical outputs of the interferometer are sent to an optical-to-electrical digitizer 103 that contains optical-to-electrical (O/E) detectors 120, 122 the output of which are sampled with electronic analog-to-digital converters (ADCs) 124,126. The ADC output signals are sent to a digital signal processing (DSP) unit 128. The DSP can estimate the applied phase and therefore the input RF signal by processing the digitized I-Q inputs. The processing to determine phase is essentially an inverse tangent function, although it can be performed in various ways such as a look-up table. The processing can take into account various system calibration issues such as imperfections in the relative phase of the optical hybrid and differences in the amplitude scale of each electronic ADC, as will be discussed.

A model representing the system of FIG. 1 may be represented by a series of equations:

$$x_c = x^* x_{scale} + x_{off};$$

$$y_c = y^* y_{scale} + y_{off};$$

$$x_r = \cos(\theta_b)^* x_c + \sin(\theta_b)^* y_c;$$

$$y_r = -\sin(\theta_b)^* x_c + \cos(\theta_b)^* y_c;$$

$$y_h = (y_r - x_r^* \cos(\theta_{hyb})) / \sin(\theta_{hyb}); \text{ and}$$

$$\phi = \arctan(y_h / x_r).$$

Here x and y are the sampled values of the I and Q signals, $x_{scale}$ and $y_{scale}$ are scaling parameters, $x_{off}$ and $y_{off}$ are offset parameters, $\theta_b$ is the interferometer phase bias, $\theta_{hyb}$ is the hybrid combining phase (ideally 90°) and $\phi$ is the inferred applied phase at the phase modulator. The offset parameters account for a DC offset to the signals caused for instance by a DC offset on the ADCs or extraneous stray light from the optical source, while the scale parameters account for the different responsivity in the overall detection/digitization paths and can be set so that $x_c$ and $y_c$ vary from {−1 to 1} over the entire operating range. The offset, scale, and hybrid combining phase parameters can be optimized by optimizing the ENOB of the calibration signal. One way to do this is by using nonlinear regression, using the above model, considering the calibration signal to be the independent variable, considering the ADC output to be the dependent variable, and solving for the parameters that result in a minimum mean square error fit. More complex models can be created if needed to account for other non-idealities. Initial estimates for the parameters can be made for instance by sampling a sinusoidal applied phase shift of an amplitude of nearly 2π over many different phases so that x and y are sampled near their maximum and minimum values and so that the expected average values of $x_c$ and $y_c$ are zero. In this case the scale parameters are chosen so that after scaling the difference between the maximum and minimum values of $x^* x_{scale}$ (or $y^* y_{scale}$) is 2, and the offset values are chosen so that $x_c$ and $y_c$ vary from {−1 to 1}. Further corrections can use the initial parameter estimates to calculate the applied phase from many sampled points and modify the parameters to obtain a maximum ENOB.

In FIG. 1 some of the optical source is tapped off using an optical tap 130 in order to send to an optical clock signal to an O/E detector 132 for generating a sample rate clock at the optical pulse repetition rate. This represents one of many ways to generate the clock. This particular method is most applicable to use with passively mode-locked lasers that do not have an electrical clock output or input. The clock distribution system 134 generates and distributes a clock to the ADCs 124,126 with the relative phases of the clocks adjusted to the optimal sampling time. In FIG. 1 the controller 136 controls (or sets) the phase of the clocks via the clock distribution system 134. Some ADCs may have a phase control built in whereby the mechanism for phase control might physically be interfaced to the ADCs directly, although in terms of block-diagram functionality such details are not relevant. The mechanism used for controlling the sampling phase to the ADCs can be controlled by the controller.

The controller can scan the phase (sampling time) of each ADC and determine where the optimal sample phase is, for instance by maximizing the variance of the signal. The ability to find the optimal sampling time is particularly useful in cases where the optical pulse repetition frequency is tunable. It allows the optical source to be changed independently of the rest of the system components while still maintaining the proper sampling time, thereby allowing the selection of an optical source with the desired optical sampling characteristics. Note that we will in general consider the DSP in control of fast operations which occur on the same time scale as the sampling and the controller in control of operations that occur over much slower time scales. This nomenclature is used for convenience although both functions could be integrated into the same electronic platform such as a field-programmable gate array and the separation is for pedagogical purposes only.

A known calibration signal 116 such as the sine wave from an electronic oscillator can be used in order to calibrate the system. In one embodiment the calibration signal causes a phase shift of approximately $2\pi$ and it is of a frequency such that phase shifts of $<2\pi/8$ occur over the sample interval (for instance a frequency $<1/10^{th}$ the sample rate). This guarantees the input signal will be sampled in at least eight different phases. For instance, if the system is sampling at 1 GHz then a calibration signal of 50 MHz could be used. If the calibration signal is $2\pi$ or above then the system is exercised over the full range of maximum and minimum values of each O/E detector and ADC digitizer combination so the scale of each of the OE/ADC channels can be easily determined. This may be useful for calibration purposes. If desired the calibration signal can be brought just under $2\pi$ to estimate the best ENOB the system is capable of under typical operating conditions. The I-Q scatterplot (a plot of I versus Q) can be analyzed which should ideally be circular. Certain effects can make it oval, such as if the phase of the hybrid combiner is not exactly $\pi/2$ (or exactly as expected, which in this case is $\pi/2$ since we are using a hybrid). Other effects such as a lower than desired detection bandwidth or a nonlinearity in the detection process can make the scatterplot distorted. The DSP can adjust the parameters it uses to determine the resulting inversion process in order to compensate for such non-idealities, including for instance modifying the combining phase of the I/Q hybrid, scaling the ADC outputs, adding a digital filter of appropriate characteristics, etc. In addition to ENOB, other indicators of performance such as spurious tones or harmonics can also be monitored. In particular, the calibration signal can contain two or more simultaneous sinusoidal frequencies and the inter-modulation tones can be evaluated to reduce inter-modulation distortion to a minimum and to monitor the actual inter-modulation distortion performance A variable attenuator or variable amplifier under the control of the controller can adjust the magnitude of the calibration signal as desired (not shown). The frequency of the calibration signal can be changed, which can either be used to characterize and optimize performance as a function of frequency or so that the sampling frequency and calibration sinusoid frequency avoid having an undesirable relationship that could make calibration more difficult, such as an integer multiple relationship that does not lead to eight or more different sample phases.

The RF selector as described time-multiplexes a calibration signal and an input electrical signal to be digitized by temporally controlling which signal is applied to the modulator. It is also possible to use a frequency combiner to combine the calibration signal with the signal to be digitized. For instance, if the calibration signal is 100 MHz and the signal to be digitized is constrained to be between 1 GHz and 40 GHz then a frequency band combiner can be used to combine the two separated bands. If desired the calibration signal can be turned on or off by the controller to also realize time multiplexing without requiring a switch.

Some of the processing in the DSP may slow down the throughput of the system. For instance, often a fast Fourier Transform (FFT) of a vector of digitized samples are processed in order to generate an output spectrum. Depending on the rate which the FFT is performed, the DSP may not be fast enough to process all the samples from the optical-to-electrical digitizer. Also, extraneous processing may increase power consumption. In some applications it may be adequate to process signals only if they are larger than a given threshold. The invention can thus estimate the signal size over a signal estimation time period, compare the estimated signal size to a threshold value, and only if the estimated signal size is above the threshold will the thresholder signal the DSP to complete certain aspects of the processing. The signal size estimating and thresholding functions can be performed using many architectures, such as splitting the input signal to be digitized into two ports and sending one of the ports to a power meter. The measured power reading can then be sent to a digital thresholder and the output of the digital thresholder sent to the DSP so the DSP can determine what kind of processing, if any, it should perform on the current samples.

Figure 2:
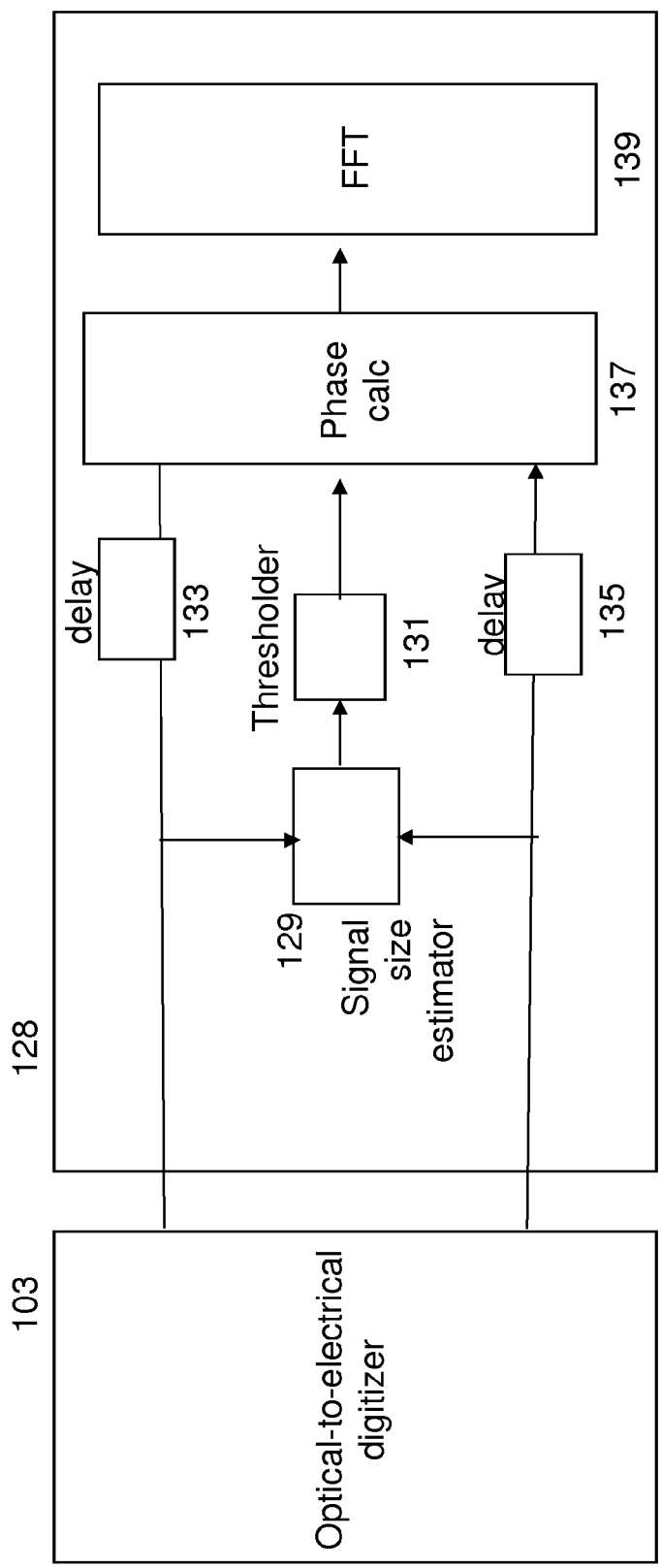
FIG. 2 Flow diagram of estimating the signal size using the DSP so that only signals of sufficient size are fully processed.

An architecture that uses DSP processing to implement the signal size estimation and thresholding is shown in FIG. 2. The signals from the optical-to-electrical digitizer 103 are sent to the DSP 128 as usual. Each of the digital signals are sent to signal size estimator 129 which estimates the signal size for instance by measuring the variance of both signals over a measurement time interval. The output of the signal size estimation block is sent to a thresolder 131 that compares the estimated power to a threshold value and signals the phase calculator 137 to continue processing the digital samples only if the estimated signal size was above the threshold. Both digital signals are delayed in separate delay elements 133,135 so that the thresholder can signal the phase calculator before the digital signals corresponding to the analyzed signal arrive for processing. This allows the phase calculator to ignore a block of samples if the thresholder signals that the block of samples have an estimated power level below the threshold. After the phase calculator a block of sampled and digitized values can be further processed in an FFT block 139.

Figure 3:
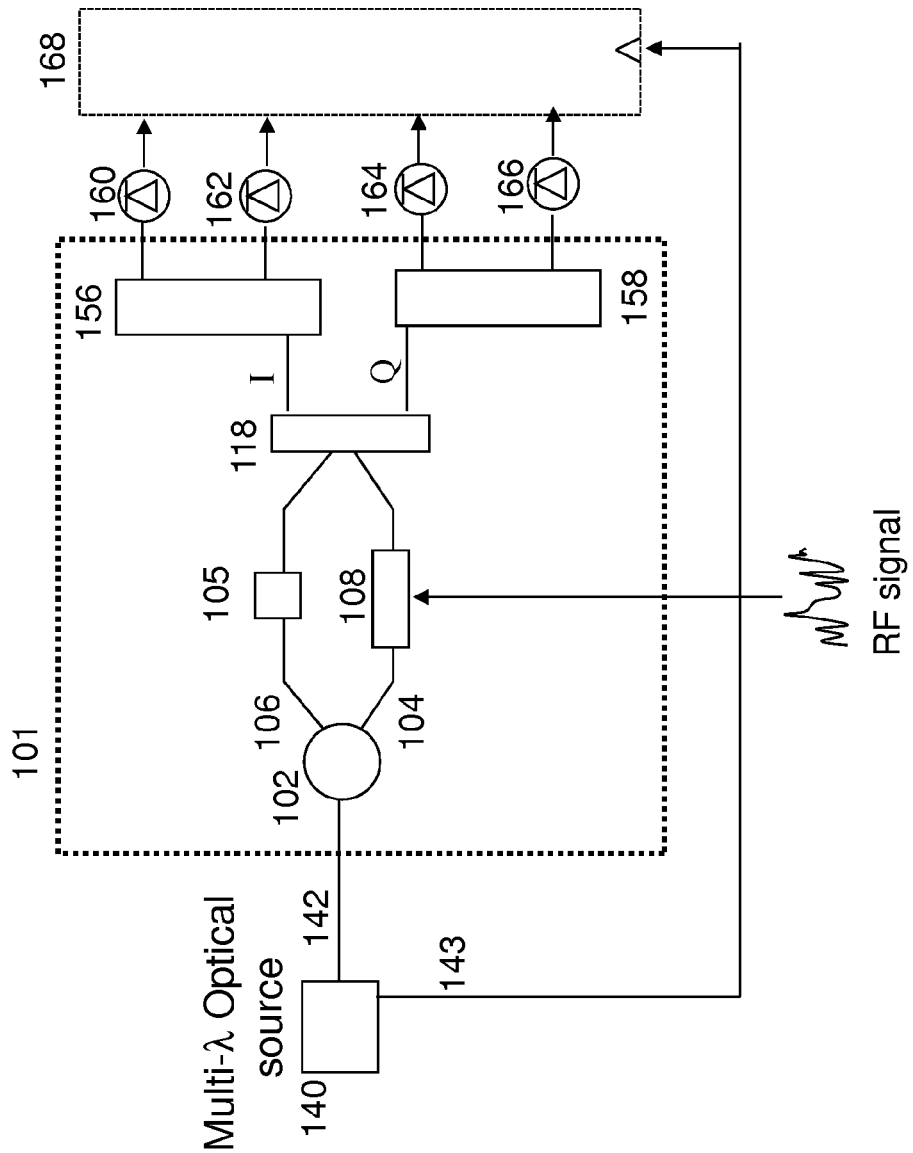
FIG. 3 A WDM multi-wavelength photonic ADC.

The photonic ADC system sample rate can be increased beyond the maximum sample rate of the electronic ADCs by employing wavelength division multiplexing (WDM). A simplified system showing the application of WDM is shown in FIG. 3. Many common components are in FIG. 1 and FIG. 3 in which case they contain the same numerical labels. A multi-wavelength source 140 which has interleaved pulses of multiple (in this case two) wavelengths is used. As an example, the overall pulse rate can be 10 Giga-pulses/second where the optical output is essentially two 5 Giga-pulses/second signals of two different wavelengths spaced in time such that a wavelength insensitive detector would measure a regular stream of pulses separated by 100 picoseconds (10 GHz). The optical output of the source 142 is sent to the optical interferometer 101 where it is split into the signal 104 and reference 106 arms by a coupler 102, the signal arm is modulated by a phase modulator 108, and the arms are re-combined in an I-Q combiner 118. The I and Q outputs of the combiner are further separated by WDM demultiplexers 156, 158 which separate the two 5 Giga-pulse/second optical signals of different wavelengths into two different arms. The I and Q signal from one of the wavelengths are measured by O/E detectors 160 and 164 respectively, while the I and Q signal from the other wavelength are detected by O/E detectors 162 and 166. All the detectors are fed into a parallel analog-to-digital converter 168 where for simplicity we assume the system has been designed so that a common phased clock can clock all the ADCs (no clock distribution system with individual phase control is required). An electrical clock 143 from the optical source at the same rate as a single wavelength of the optical pulse train (5 GHz) is used to clock the ADCs. The calibration procedure can be performed separately for each wavelength. Each channel can initially be calibrated by selecting calibration values that give the best performance (highest ENOB) when looking at just one wavelength channel at a time. The channels can be combined to form an aggregate higher sample rate system and any remaining channel-to-channel variations can be compensated in the DSP so as to optimize the system performance at the full sampling rate.

Figure 4:
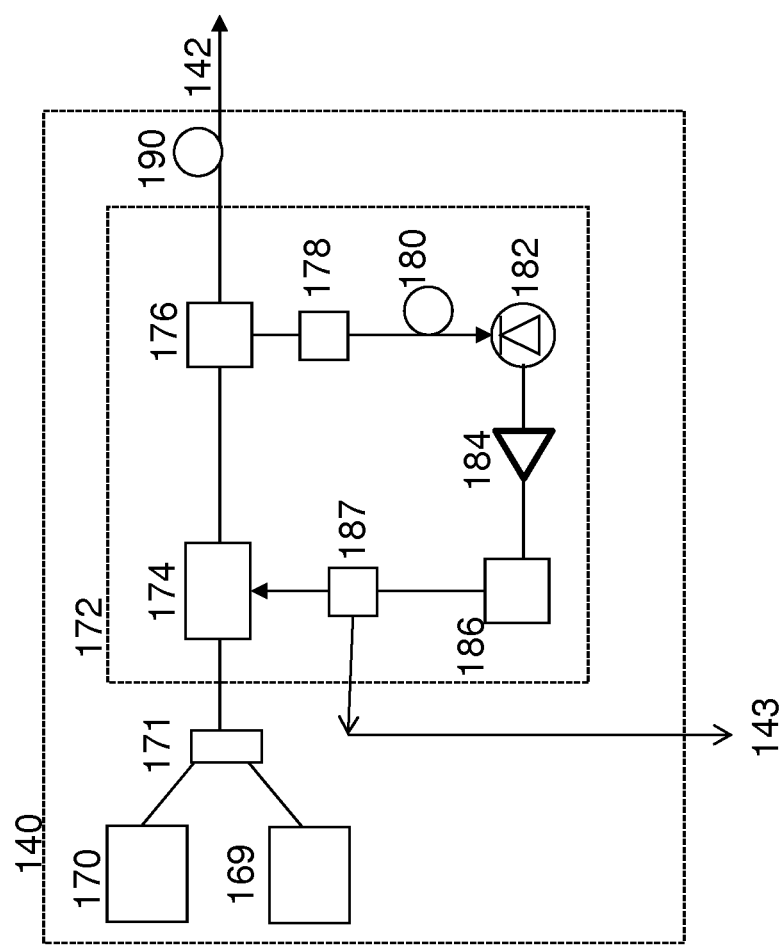
FIG. 4 A mutli-wavelength OEO generating interleaved optical pulses and an RF synchronization signal.

An interleaved multi-wavelength source 140 can be constructed in a number of different ways. In one embodiment, an opto-electric oscillator (OEO) can be used to create both the optical source and the electrical clock. FIG. 4 is an example of such a system. A multiwavelength source such as the combination of multiple continuous wave (CW) lasers 169,170 in an optical combiner 171 is the optical input to the OEO 172. We note other inputs such as an optical frequency comb source can also be used. A modulator 174 modulates all the wavelengths, such as can be realized with an electroabsorption modulator or other intensity modulator or a phase modulator followed by appropriate filtering, or some combination thereof. A part of the modulated optical signal is tapped off in a tap 176 to generate a feed-back signal. The optical signal is filtered in an optical band-pass filter 178 so only one wavelength propagates through the OEO cavity and this signal propagates through a low-loss optical fiber delay 180 in order to extend the cavity length and therefore the cavity Q. Note that more sophisticated feedback methods including the use of multiple lengths of fiber are possible. The optical signal is detected with an O/E detector 182, amplified in an amplifier 184, filtered in an electrical band pass filter 186, and sent to an electrical tap 187. One output of the electrical tap is sent to the modulator 174 as the RF driving voltage to complete the OEO feedback loop. Another output of the electrical tap is an electrical clock 143. The optical tap 176 output is sent through a dispersive element 190 such as optical fiber to interleave the pulses in time since the pulses of different wavelength travel at different relative speeds through the dispersive line. Alternatively, a different temporal interleaving method such as a WDM splitter with a relative delay for one wavelength equal to ½ a bit period before recombining the wavelengths in another WDM could be used. An interleaved 10 Gigapulse/s optical signal is at the output of the OEO cavity 142. In a modified configuration the fiber making up the dispersive element 190 and the fiber making up the fiber delay 180 can be the same fiber. In this case the dispersive fiber would be located inside the OEO cavity, but before the OEO cavity output, such as immediately before the optical tap 176. The dispersive element has a differential group delay so that the pulses of different wavelength travel at different relative velocities. The exact amount of dispersion and the exact optical wavelengths used can be set so that the OEO output 142 is a series of pulses located at equal time intervals with interleaved wavelengths. In practice the wavelengths of the lasers 169,170 seeding the multiwavelength source can be tuned by tuning the wavelengths of the lasers combined to optically seed the OEO or by tuning the spacing of the optical comb source used to seed the OEO if an optical comb source is used instead of individual lasers. The seed laser wavelength control allows a fine tuning of the relative time delay between the two pulse-streams of different wavelength so that the arrival time of the optical pulses after the dispersive element can be exactly evenly spaced. This can be especially important if the length of dispersive fiber 190 required to compress the potentially frequency-chirped optical pulses out of the optical tap 176 to a desired pulse-width is fixed, as in this case the amount of dispersion in the dispersive element 190 is not a free parameter. There are various types of OEO configurations in the prior art which are inherently compatible with the invention, with an aspect of the invention being the method of creating an interleaved multi-wavelength output of the OEO.

Figure 5:
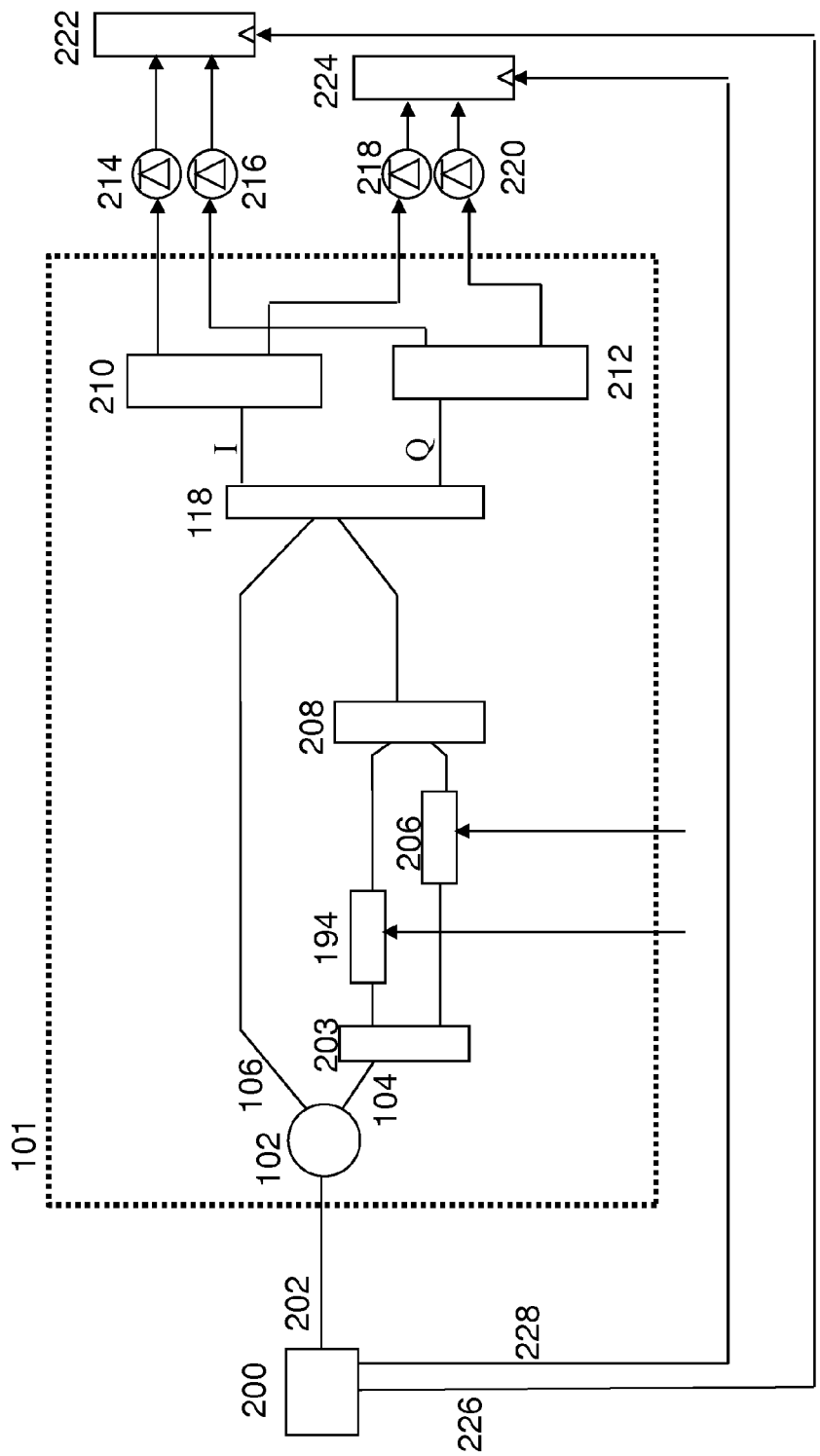
FIG. 5 Two wavelength WDM ADC with two separate electrical input signals.

Instead of using multiple wavelengths of light to extend the sampling rate of a single signal to be digitized, one can use the multiple wavelengths to allow for multiple input signals to be simultaneously digitized. This could be useful, for instance, in antenna arrays where multiple signals need to be processed simultaneously. Another useful case would be if the photonic ADC system is working in the under-sampling regime, but the input RF signal has multiple non-overlapping frequency bands of interest that together span a frequency range larger than ½ the sample period. In this case the individual signal bands can be split and sent to different modulators with each modulated signal being under-sampled. A basic diagram of a multi-signal photonic ADC digitizer is shown in FIG. 5. The input source could be a pulsed multi-wavelength source 200 or a very short pulse single-wavelength source which can be filtered as needed to create multiple wavelength bands. In the embodiment of FIG. 5 the source is a mode-locked laser with a short pulse-width of ~1 ps and thus a wide spectral bandwidth of about five nanometers. However, one could alternatively use multiple mode-locked lasers with different repetition rates to generate the two wavelengths, a multi-wavelength OEO, or a number of other variations. The optical output of the source 202 is sent to the multiple-modulator I/Q interferometer to be split by the splitter 102, and the signal arm 104 is further split by a pre-modulator WDM 203 into waveband-A which is modulated by modulator-A 194 and waveband-B which is modulated by modulator-B 206, before being recombined in a post-modulator WDM 208. The reference arm is recombined with the signal arm after the post-modulator WDM in the I/Q combiner 118. WDM demultiplexers 210,212 are used to separate the two modulated wavelength bands. The two wavebands could be ~1 nm in spectral width and have central wavelengths separated by ~1.8 nm (200 GHz). Such values are compatible with typical WDM filters. The I signals at the two wavebands are detected by two I detectors 214,218 and the Q signals are detected by two Q detectors 216,220. The I and Q signals from waveband-A are digitized in a bank of ADCs 222 and the I and Q signals from waveband-B are digitized in another bank of ADCs 224. Each ADC bank can be clocked at a different frequency by one of the source electrical clock outputs 226, 228 that are synchronized to the pulse rates at their respective wavelengths. We note that in this embodiment where the source is a single wavelength laser the two electrical clock outputs are the same frequency. However, in other configurations the two wavebands could be generating pulses at different frequencies, such as if the multi-wavelength source is composed of two separate lasers of different wavelength and repetition frequencies, in which case they will have different ADC sample clocks.

Each waveband, one detected with O/E detectors 214,216 and the other detected with O/E detectors 218,220 can use O/E detectors and subsequent ADCs optimized for the applied signal and sampling rate of the respective waveband. In the embodiment of FIG. 5 both wavebands comes from a single mode-locked laser and thus have the same repetition rate. However, it is possible that the two wavebands can have different repetition rates. For this reason the optical source has multiple electrical clock outputs, and the electronic ADCs used to digitize each waveband can be clocked at a different rate. The type of ADC used for each waveband can be optimized depending on the desired application, as can the O/E detector. For instance, if one waveband has a much lower optical pulse repetition rate then the other waveband then a photodetector with a smaller bandwidth and an ADC with a smaller maximum sampling rate and thus a higher ENOB can be used for the lower pulse repetition rate waveband, which can help improve the performance. Using WDM to increase the sample rate as per FIG. 3 can also be combined with using WDM to increase the number of signals sampled as per FIG. 5 in a straight forward way.

Figure 6:
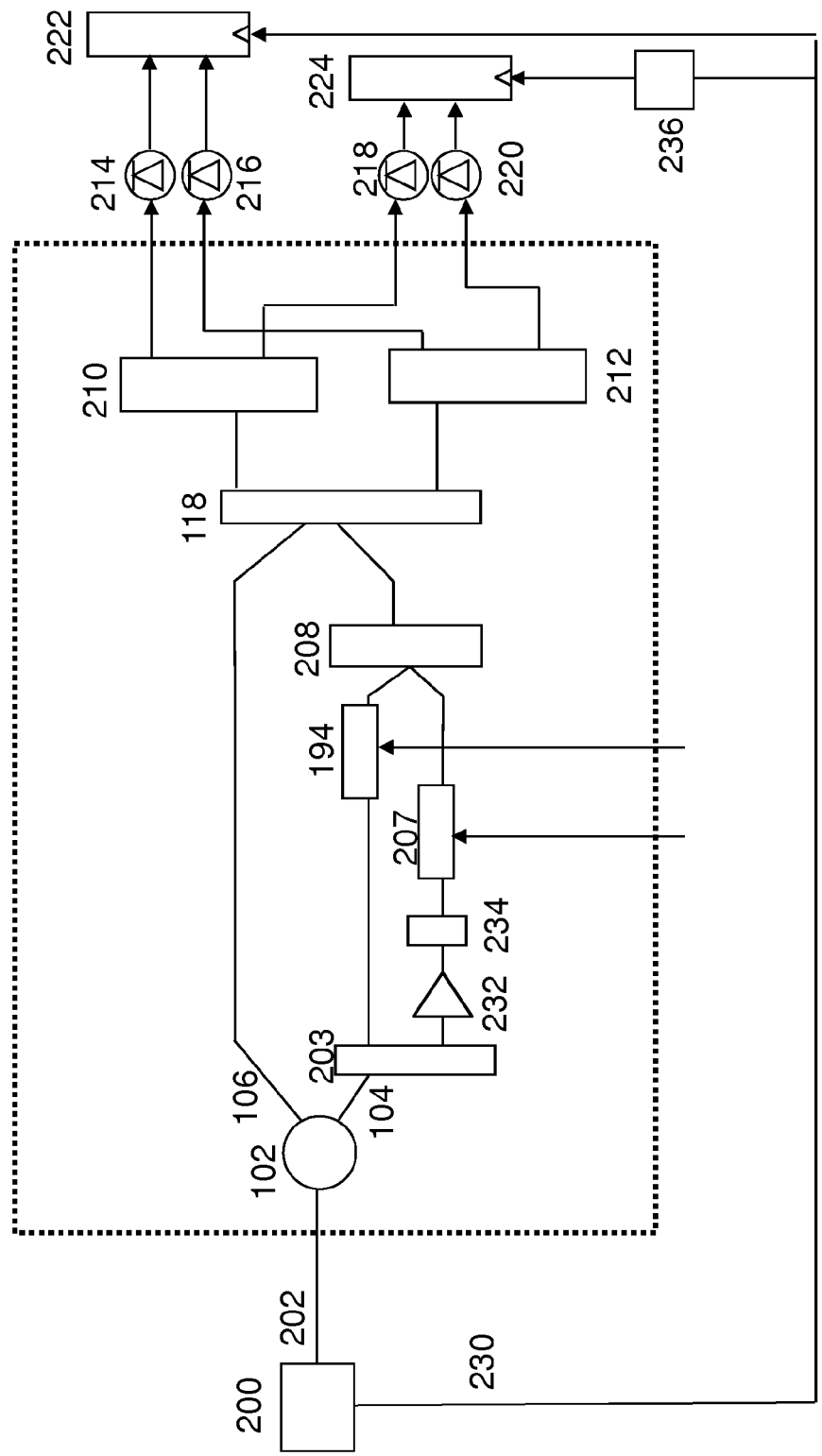
FIG. 6: Two wavelength WDM ADC with two separate input signals where each signal is digitized at a different sample rate.

A modified embodiment shown in FIG. 6 can use the same mode-locked laser source 200 to generate each waveband, but includes a rate multiplication element 234, such as a periodic filter that can be realized by an etalon filter or a passive split-delay-recombine based multiplexer, to change the repetition rate in one of the wavebands. A fiber amplifier 232 can be included in this waveband to compensate for the insertion loss of the rate multiplication element if needed. As an example, the laser repetition rate can be 1 GHz, but a 10 GHz free-spectral range etalon filter can filter one of the wavebands to convert the pulse rate to 10 GHz. Such a filter could be placed directly before one of the phase modulators, in this case phase modulator 207. In this way two different pulse rates can be generated from the same low-noise laser, where each repetition rate is suitable for digitizing different types of applied signals or gaining different types of information from them. An electrical clock from the source 230 is multiplied by a factor of n in a clock multiplier circuit 236 in order to clock the ADC bank that digitizes waveband-B (the waveband with the higher optical pulse repetition rate). Otherwise the system is similar to FIG. 5. The O/E detectors and the ADC bank for each waveband can be independently optimized. If the center frequency of the signals driving either modulator 194 or modulator 207 are known and the center frequencies are large compared to the bandwidth of the signal, then it is helpful to use resonant modulators which have a frequency dependence such that in a particular frequency band they have enhanced transfer functions allowing for input frequencies in this frequency band to be of a smaller voltage magnitude, in order to reduce the magnitude of the applied voltage to the modulator that will cause a given amount of phase shift. The system is useful for digitizing multiple narrow RF-wavebands, such as at center frequencies of 10 GHz with a 500 MHz bandwidth and center frequencies of 12 GHz with 1 GHz bandwidth, in which case the RF signals driving the two phase modulators 204,207 might originate from the same receive antenna and be split by a frequency splitter to the relevant phase modulator. The 10 GHz signal with 500 MHz bandwidth can use a source laser of 1 GHz optical repetition frequency, while the 12 GHz carrier with 1 GHz bandwidth signal can multiply the optical repetition rate by 2 so it becomes 2 GHz in order to enable sampling over the desired bandwidth.

A means of controlling the repetition rate of the optical source can be used to allow for sampling at different rates. For instance, a 10 GHz repetition rate laser could have an optical chopper after it, consisting of an optical modulator driven by a pulse generator, allowing the optical repetition rate to be divided by an integer number. For cases where 5 GHz bandwidths (10 Gsps) are required the chopper could be turned off. If smaller bandwidths are acceptable then the chopper could reduce the pulse rate, for instance to 100 MHz for a 50 MHz bandwidth signal. One benefit of chopping the source is that the lower repetition rate reduces the frequency band over which phase noise influences jitter, thereby reducing the effective amount of jitter and improving the ENOB. Also, slower O/E detectors and ADCs can be used which can further improve ENOB.

Figure 7:
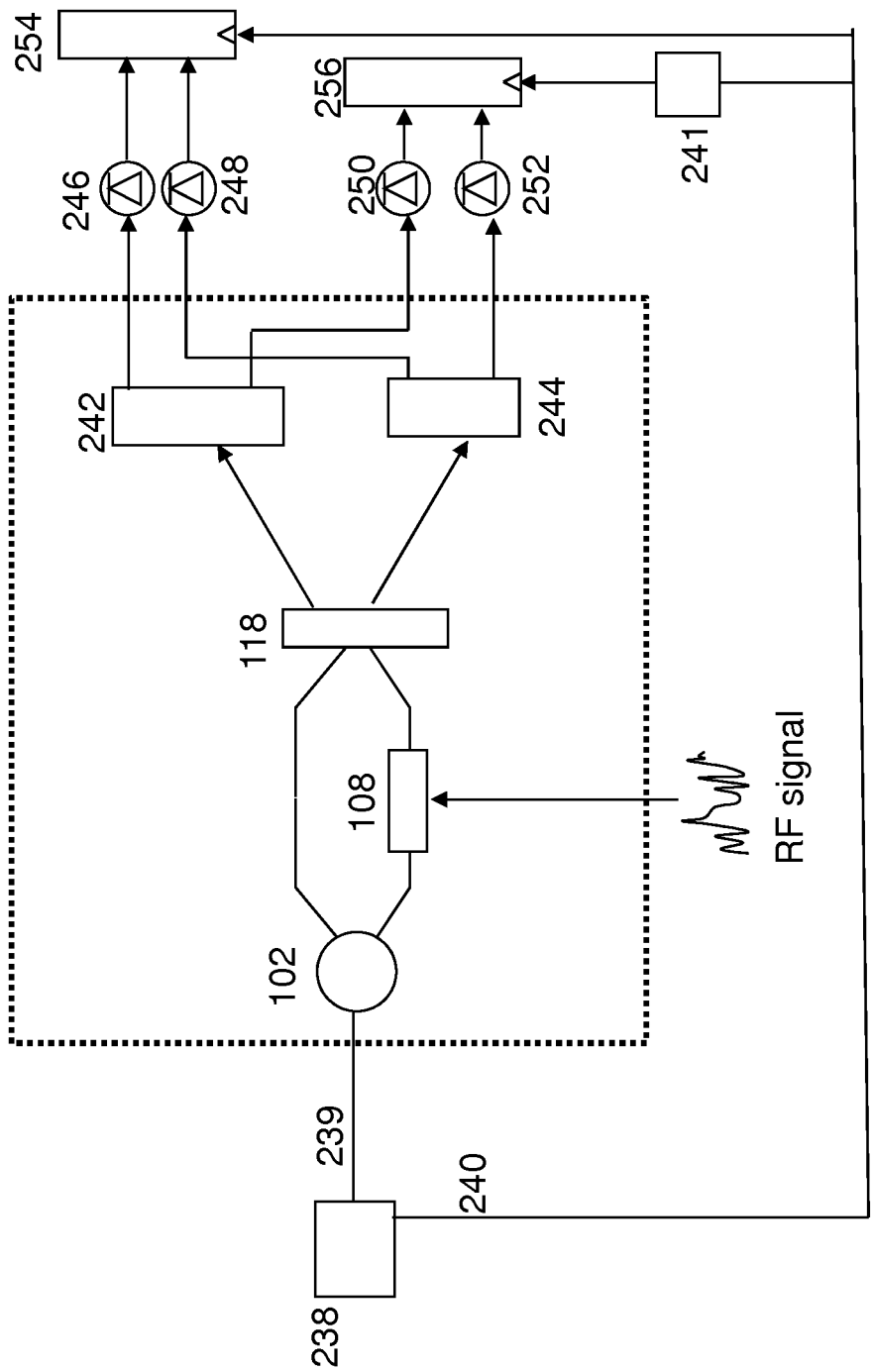
FIG. 7: Photonic ADC digitizing an input signal using two different types of O/E's and two different types of ADC's in order to simultaneously optimize performance at two different sample rates.

In the embodiment of FIG. 7 the repetition rate of the optical tunable frequency source 238 can be tuned from 10 GHz to 100 MHz optical pulse repetition rates, using for instance an optical chopper to modify the natural repetition rate. The two-order-of-magnitude difference in repetition rate means that the O/E detectors and electronic ADCs used at these different rates should be independently optimized. At 10 GHz, wide band O/E detectors 246,248 with a 20 GHz bandwidth could be used followed by an electronic ADC bank 254 that functions at 10 Gsps with ~6 ENOB. This system of O/E and ADCs would be used when the optical tunable frequency source is sent to a high repetition rate. The high rate ADC bank 254 is clocked with the electrical clock out of the source 240. Optical splitters 242,244 split the I and Q signals into another system of lower-speed O/E detectors 250,252 and a lower speed ADC bank 256. For instance, the lower speed detectors might have a 1 GHz bandwidth and the lower speed ADCs may be ADCs with a maximum sample rate of 500 Ms/s and a relatively wide 1 GHz front-end bandwidth. If the optical source is set to 10 GHz, the high speed O/E detectors and ADC bank are used. If the optical repetition rate is set to <500 Ms/s then the lower speed O/E detectors and ADC bank are used. In this way performance either optimized for high bandwidth sampling or low bandwidth sampling can be selected. A frequency divider 241 allows the low bandwidth samplers to sample at frequencies even lower than the minimum pulse repetition frequency of the optical source, for instance 10 MHz if the optical source is set to 100 MHz and the divider is set to divide the clock to 10 MHz.

The system of FIG. 7 can be slightly modified to function with a single laser repetition rate. The performance of this modified configuration may be somewhat worse, however the advantage being that high bandwidth lower-resolution and low bandwidth higher-resolution digitization can occur simultaneously. This scheme might be an advantage if the bandwidth of a signal to be digitized is low over a short sampling interval, but may be much larger over a longer sampling interval. In such a case the high bandwidth sampling can track drifts of the instantaneous average center frequency over large frequency ranges, while the low bandwidth high resolution sampling can measure the signal over short time frames. By processing the information from both samplers a more complete measurement is made yielding more information than either sampler can otherwise produce alone. To realize such an embodiment, the I/Q output is sampled at two different frequencies, for instance with the high rate I/Q O/E detector and ADC pair being sampled at 10 Gsps using an ADC, and the low rate I/Q O/E detector ADC pair being sampled at a lower rate such as in the range of 10 MHz to 1 GHz. This lower rate ADC pair can be realized for instance with a track-and-hold circuit followed by a 1 GHz capable ADC. The track-and-hold circuit should have a wide input bandwidth capable of isolating a single optical pulse, such as a 10 GHz input bandwidth. The fast ADC pair is sampled at the pulse repetition rate using a clock out of the optical source 240 at the pulse repetition rate, while the slower ADC pair gets its clock from the clock divider 241 set to divide the optical source repetition rate clock by the appropriate factor. In this way the optical source is not chopped, but the lower rate sampling is obtained by effective electronic chopping by the high-bandwidth track-and-hold circuit since the high-bandwidth nature of the track-and-hold sampler allows it to select an isolated pulse to sample. This method allows for improved jitter as before since the sample rate is lowered but now the high rate and low rate sampling can occur simultaneously and without the need for optical chopping. The drawback is that the low-rate O/E detector needs to maintain a wider bandwidth suitable for isolating each optical pulse (on the order of 10 GHz) and low-rate sampler composed of the high bandwidth track-and-hold circuit followed by the 1 GHz capable ADC will likely not have as high of an ENOB as a lower rate ADC (which would not be capable of isolating individual pulses). However, the jitter will still be reduced and the track-and-hold/1 GHz ADC pair can have a larger ENOB than the 10 GHz ADCs. Thus improved performance can still be realized when sampling at lower rates, and the sampling rate can be selected in the large 10 MHz-1 GHz range by changing the sampling clock to the track-and-hold/ADC pair, which is easily changeable by modifying the amount of division in the clock divider 241. The actual rate range can be modified as desired and as technology will allow.

While certain exemplary embodiments have been described and shown in the accompanying drawings, it is to be understood that such embodiments are merely illustrative and not restrictive of the broad invention and that this invention is not limited to the specific constructions and arrangements shown and described, since various other modifications may occur to those ordinarily skilled in the art upon studying this disclosure. In an area of technology such as this, where growth is fast and further advancements are not easily foreseen, the disclosed embodiments may be readily modifiable in arrangement and detail as facilitated by enabling technological advancements without departing from the principals of the present disclosure or the scope of the accompanying claims.

What is claimed is:

1. An apparatus for digitizing an input electrical signal, comprising: an optical interferometric modulator, which modulates an input optical signal by the input electrical signal and produces two or more optical output signals; the input electrical signal including a calibration signal; a control unit that controls the multiplexing of the electrical input signal and the calibration signal; two or more photoreceivers receiving the output optical signals from the optical modulator, the photoreceivers outputting output electrical signals, the photoreceiver output electrical signals are digitized in an analog-to-digital converter then processed in a digital signal processor (DSP), the DSP outputs a digitized value for the input electrical signal, wherein the DSP analyzes the calibration signal to optimize the processing used to compute the input electrical signal digitization.

2. The apparatus of claim 1, wherein the calibration signal is time multiplexed with the input electrical signal.

3. The apparatus of claim 1, wherein the calibration signal is frequency multiplexed with the input electrical signal.

4. The apparatus of claim 1, wherein the digitization optimization includes changing offset and scale parameters of the digitized photoreceiver output signals.

5. The apparatus according to claim 1, wherein the calibration signal contains multiple sinusoidal voltage signals of different frequencies and intermixing terms generated in the digitized calibration signal are measured.

6. The apparatus according to claim 1, wherein the frequency of the calibration signal is set so that the calibration sinusoid is sampled in at least eight different phase locations during a measurement time span over which the digitized electrical input signal is processed and evaluated.

7. The apparatus according to claim 1, where the optical signal input is generated in a pulsed optical source.

8. The apparatus of claim 7, where the calibration signal is a sinusoidal signal of a known frequency and the repetition rate of the pulsed optical source is determined by analyzing the digitized calibration signal.

9. The apparatus according to claim 7, wherein the repetition rate of the pulse optical source is measured in a frequency measurement device to determine the sampling frequency.

10. The apparatus according to claim 1, wherein the interferometric modulator contains an optical hybrid and the optical output signals from the optical modulator are the outputs of the optical hybrid.

11. The apparatus according to claim 1, wherein the digitization optimization includes calculating the interferometric combining phase associated with the output optical signals of the optical interferometric modulator.

12. The apparatus according to claim 1, wherein the multiple optical output signals of the interferometric modulator are further split into a plurality of copies by multiple splitters, and each of the plurality of copies can be digitized using different sampling frequencies or different digitization bandwidths or both different sampling frequencies and different digitization bandwidths thereby obtaining different digitization performance characteristics.

13. The apparatus of claim 12, wherein the input optical signal is a pulsed optical signal of a variable repetition rate, and one of the copies of the optical output signals are digitized with analog-to-digital converters (ADCs) at higher sampling rates and one of the copies are sampled with ADCs of lower sampling rates, and the lower sampling rate ADCs are processed by the DSP when the optical signal is pulsed at a rate compatible with the lower sampling rate ADCs, while the higher sampling rate ADCs are used otherwise.

14. The apparatus according to claim 1, wherein the input optical signal is a wavelength division multiplexed (WDM) signal, further comprising wavelength division multiplexers at the optical output signals of the optical interferometric modulator to separate the optical outputs into a plurality of wavebands where each waveband can be independently detected with photorecievers, digitized, and processed in the DSP to improve the input electrical signal digitization.

15. The apparatus of claim 14, further comprising an optical source that generates a pulse train with a plurality of wavelengths such that the temporal location of pulses from the various wavelengths do not overlap, thus the sampled wavebands represent different sample times of the electrical input signal.

16. The apparatus of claim 15, wherein the optical source is an opto-electronic oscillator and the temporal location of the pulses of various wavelengths are controlled by the use of a dispersive optical element.

17. The apparatus of claim 1, further comprising a signal size estimator that estimates the input electrical signal size over a signal evaluation time period and a threshold function that determines if an estimated signal size is above a set threshold, whereas if the threshold function determines the estimated signal size is above the threshold the DSP will perform certain processing functions on the samples and record or display the results of the processing evaluation, while if the threshold function determines the estimated signal size is below the threshold the DSP will not process the series of samples, the threshold function thus acting to reduce the amount of processing required in the DSP during times when the signal is likely to be too small to be of interest.

18. The apparatus of claim 1, whereas the optical interferometric modulator contains a phase modulator which has a resonant frequency response.

19. An apparatus for sampling and digitizing a plurality of electrical input signals, comprising: one or more optical signal inputs, a plurality of electrical input signals, an optical interferometer that contains a plurality of optical modulators in parallel, where each optical modulator is fed by an input optical signal of different wavelength and each optical modulator is driven by one of the plurality of electrical input signals, an optical signal digitization block that receives the plurality of optical output signals from the optical interferometers and digitizes them, a digital signal processor (DSP) that receives the digitized outputs from the optical signal digitization block and processes the digitized outputs to calculate a digitized value for the plurality of electrical input signals, wherein the sampling frequency of the digitization can be different for the different wavelengths.

20. The apparatus of claim 19, further comprising a pulsed optical source of a single repetition frequency producing one or more optical signal inputs and at least one rate multiplication element before at least one of the modulators, where the rate multiplication element changes the sampling rate from the repetition frequency of the optical source to a different repetition frequency.

21. The apparatus of claim 19, further comprising a known calibration signal multiplexed with the electrical input signals, the calibration signal used by the DSP to determine optimal processing parameters for each wavelength in order to optimize digitization performance.

22. A method of sampling and digitizing at least one electrical signal, comprising: sampling at least one electrical input signal by sending optical pulses through a multiple-output optical interferometer that contains at least one optical modulator that is modulated by the electrical input signal, digitizing the outputs of the optical interferometer, processing the digitized outputs of the optical interferometer to calculate the digitized electrical input signals at the sample times, and multiplexing a calibration signal with the electrical input signal the processing parameters used for optimally digitizing the electrical input signal.

23. The method of claim 22, whereas there are two or more optical modulators modulated by separate electrical input signals and the optical wavelength used for each optical modulator is unique, and the wavelengths are separately digitized and processed to digitize the electrical input signals.

24. The method of claim 23, wherein an optical pulse rate sent to the optical interferometer is the same for all wavelengths, whereas for at least one wavelength the optical pulse rate is changed by modifying the optical spectrum near the chosen wavelengths so that at the output of the interferometer the pulse rate near the modified wavelength is different from the pulse rate sent to the optical interferometer allowing more than one digitization frequency to be used.

25. The method of claim 22, further comprising splitting at least some of the signal outputs from the optical interferometer into multiple copies, and digitizing the multiple copies with different digitization bandwidths or different sample rates or both different digitization bandwidths and sample rates so that the same electrical input signal is digitized with different performance properties.

26. The method of claim 25, whereas the different performance properties achieved on the different interferometer copies are used to analyze the electrical input signal so as to obtain more information about the electrical signal than would be possible with just a single copy of the signal.

27. The method of claim 22, whereas the calibration signal is a sinusoidal frequency of a precisely known frequency, and digitizing the calibration signal allows the repetition rate of the optical source to be determined in order to precisely determine the sampling rate.

28. The method of claim 22, wherein the repetition frequency of the optical source is measured and used to determine the interval time between samples.

29. The method of claim 22, where the samples over a given measurement time interval are processed to calculate the digitized electrical input signal only if the input electrical signal size is determined to be above a threshold value.

30. The method of claim 22, where the digitization quality of the calibration signal is used for performance monitoring.

* * * * *